United States Patent [19]
Tanaka et al.

[11] Patent Number: 5,097,392
[45] Date of Patent: Mar. 17, 1992

[54] CONTROLLER MOUNTING STRUCTURE

[75] Inventors: Masanori Tanaka, Osaka; Tomoji Yoshida, Urawa, both of Japan

[73] Assignees: Hosiden Corporation, Osaka; Clarion Co., Ltd., Tokyo, both of Japan

[21] Appl. No.: 612,139

[22] Filed: Nov. 9, 1990

[30] Foreign Application Priority Data

Nov. 9, 1989 [JP] Japan .................................. 1-289955

[51] Int. Cl.$^5$ ...................... H05K 7/14; H01R 13/627
[52] U.S. Cl. .................................... 361/391; 361/346;
361/413; 439/131; 439/298; 439/372
[58] Field of Search ............... 312/7.1; 248/27.1, 27.3;
361/346, 391, 413, 426; 439/131, 297, 298, 326,
327, 341, 342, 372

[56] References Cited
U.S. PATENT DOCUMENTS

| 4,940,414 | 7/1990 | Lee | 439/298 |
| 4,954,928 | 9/1990 | Jullien | 361/391 |

*Primary Examiner*—Gregory D. Thompson
*Attorney, Agent, or Firm*—Kenneth L. Sherman

[57] ABSTRACT

A controller mounting structure for a controller which can be removed from a front panel of the structure when the structure is not being used. The panel has a mounting port for the controller, and a first connecting terminal means arranged inside of the mounting port. A second connecting terminal means which connects with the first connecting terminal means is arranged within the controller. The mounting port has a terminal protecting element which protects the first connecting terminal means when the controller is removed. The terminal protecting element is forced toward the controller by an urging member. When the controller is being mounted on the mounting port, the terminal protecting element pushes the controller and the terminal protecting element acts as a damper for the shock of mounting operation.

13 Claims, 14 Drawing Sheets

CONTROLLER MOUNTING STRUCTURE

BACKGROUND OF THE INVENTION

This invention relates to a controller mounting structure for detachably mounting a controller on a vehicle, and more particularly to a controller mounting structure including connecting terminals provided on both sides of a controller and a vehicle mounted type equipment to which the structure is applied.

Recently, electronic equipments of the vehicle mounted type such as a mounted type acoustic equipment and the like have been diversified and improved in quality and function, resulting in occurrence of a serial problem that the equipments are frequently stolen.

In order to solve the problem, an antitheft device is proposed which is constructed so as to previously store a secret identification code in the equipment, to thereby keep the equipment non-operative unless a code input thereto coincides with the identification code.

Such a typical antitheft device which has been conventionally used for this purpose is disclosed in, for example, Japanese Patent Application Laid-Open Publication No. 105738/1987 and generally constructed in such a manner as shown in FIGS. 1 and 2. More particularly, the conventional antitheft device includes operation keys 200 through which the storing of an identification core and the inputting of a code are carried out. Also, the device includes an indicator 202 for displaying a code input thereto and a control block 204 for comparing the input code with the stored identification code, as well as a diode switch 206 adapted to indicate the identification code through an ON/OFF combination and driven directly by a battery 208. The so-constructed conventional antitheft device, as shown in FIG. 2, requires a code to be input only when a back-up power is cut off.

The conventional antitheft device constructed as described above prevents the stored identification code from being canceled or erased even when a power supply is cut off, because the identification code is stored using the diode switch 206. Also, the conventional device judges that an equipment is stolen when the equipment is detached from a vehicle to cause the back-up power to be cut off and merely requires the identification code to be input only when the equipment is then turned on again for activation. Thus, the device eliminates the necessity of inputting the identification code every time when the equipment is activated, resulting in the operability being improved.

However, the conventional antitheft device is complicated in construction, to thereby cause the manufacturing cost to be highly increased. Also, the use of an identification code is widely carried out in various fields, leading to troubles such as confusion between identification codes, forgetfulness of identification codes and the like. Thus, there is a fear that even an owner would fail to operate the antitheft device and therefore the equipment.

In order to avoid the disadvantage of the device, such an electronic equipment of the vehicle mounted type as disclosed in Japanese Patent Application Laid-Open Publication No. 26884/1989 is proposed, which is constructed as shown in FIGS. 3 and 4.

More particularly, the proposed equipment includes an inner casing 210 in which a body 212 of the equipment is removably received. The equipment also includes a handle 214 pivotally movably arranged on the front surface of the body 212 through a connection member 216, so that the equipment body 212 may be removed from the inner casing 210 by pivotally moving the handle 214 in the forward direction and forward pulling the body 212 through the handle 214.

Such construction of the equipment permits the equipment body 212 to be carried by hand when a user gets away from a vehicle on which the equipment is mounted. Also, the proposed equipment is simplified in internal circuit construction, to thereby keep the manufacturing cost at a low level. Also, it escapes from the above-described disadvantages due to the use of an identification code.

Nevertheless, the equipment has a disadvantage that it is highly troublesome to remove the equipment body 212 from the vehicle for only the antitheft purpose and the carrying of the equipment body is a burden to a user because it is considerably weighty, resulting in the equipment failing to cause the user to recognize its usefulness or availability. Thus, the user generally gets away from the vehicle while keeping the equipment body 212 received in the inner casing 210, to thereby cause an opportunity of theft of the equipment to be rather increased.

A controller mounting device or structure is known in the art which is constructed in such a manner that the portion of a panel including a control means constitutes a controller detachably mounted on the panel. Such a controller mounting structure is disclosed in, for example, in Japanese Utility Model Application Laid-Open Publication No. 138794/1988 and, as shown in FIGS. 5 and 6, adapted to control a body 218 of an equipment such as a vehicle mounted type electronic equipment by means of only a command fed from a remote control unit 220 constituting a part of a panel 222 arranged on the front portion of the equipment body 218.

The remote control unit 220 is provided on the front surface thereof with operation key means 224 and adapted to be removably received in a mounting port 226 formed at the panel 222. The remote control unit 220 received in the mounting port 226 is constantly forward forced through the rear surface 232 thereof by an urging member 228 provided with a spring 230 and arranged rearward of the unit 220. Also, the remote control unit 220 is formed on one of the side surfaces thereof with an engagement hole 234 and correspondingly the mounting port 226 is provided on one of the side surfaces thereof with a slidable or projectable engagement element 236. The engagement element 236 is constantly forced into the mounting port 226 by means of a spring 238, so that when the remote control unit 220 is received in the mounting port 226, the element 236 is engagedly fitted in the engagement hole 234 of the unit 220 to lock the remote control unit 220 in the panel 222. The engagement element 236 is tapered at the distal end thereof as indicated at reference numeral 240, to thereby facilitate the fitting of the element 236 in the engagement hole 234 of the remote control unit 220. The element 236 is slidly disengaged from the hole 234 by pushing a lock release button 242.

The remote control unit 220 is provided on the other side surface thereof with a connecting terminal 244 and correspondingly the mounting port 226 is provided on the other side surface thereof with a connecting terminal 246. The connecting terminals 244 and 246 are electrically connected together when the remote control unit 220 is received in the mounting port 226, resulting in charging of the remote control unit 220 through a battery, transmission of a signal from the remote control unit to the equipment body 218 and the like being carried out.

In the conventional controller mounting device or structure constructed as described above, the detachable controller constitutes the remote control unit 220, resulting in the operability of the equipment being improved. Also, the application of the device to a vehicle-mounted type electronic equipment effectively prevents the equipment from being stolen.

More particularly, if the remote control unit 220 is removed from the panel 222 for carrying when a user gets away from a vehicle, it is apparently externally recognized that the equipment is not kept normally operative, resulting in preventing the theft of the equipment. Also, the controller mounting structure is simplified in internal circuit construction as compared with the above-described prior art, to thereby reduce the manufacturing cost. Further, the remote control unit 220 is small-sized and reduced in weight as compared with the equipment body, as well as readily removed from the equipment body. Therefore, a user tends to remove the remote control unit 220 from the equipment body when getting away from the vehicle, to thereby effectively prevent the theft of the equipment.

Unfortunately, in the conventional controller mounting structure, it is required to arrange the urging member 228 for the remote control unit 220 and the engagement element 236 for locking in the panel 222, so that the panel 222 is highly complicated in construction. In particular, it is required to provide the panel 222 with a large space for arranging the urging member 228 because it includes the spring 230, so that the panel is increased in depth, to thereby fail to small-size the equipment.

Also, the mounting of the remote control unit 220 in the panel 222 causes static electricity to be charged on the unit 220, which is then transmitted to the internal circuit of the equipment body 218 through the connecting terminals 244 and 246, leading to damage to a control device contained in the body 218.

Further, when the mounting and detaching of the remote control unit 220 with respect to the panel 222 are repeated many times, there is increased a possibility that the connecting terminals 244 and 246 are damaged due to shock during the mounting operation. The damage of the connecting terminals renders not only the operation of the equipment body 218 by the remote control unit 220 impossible, but charging of the remote control unit 220 through the terminals from a power supply impossible.

Thus, the conventional controller mounting structure causes the equipment and terminals to be damaged due to static electricity and shock and the construction of the panel to be complicated to a degree sufficient to large-size the equipment and increase the manufacturing cost.

SUMMARY OF THE INVENTION

The present invention has been made in view of the foregoing disadvantages of the prior art.

Accordingly, it is an object of the present invention to provide a controller mounting structure which is capable of permitting a controller to be readily detachably mounted on an equipment with safety and reliability.

It is another object of the present invention to provide a controller mounting structure which is capable of exhibiting satisfactory reliability in operation and good operability.

It is a further object of the present invention to provide a controller mounting structure which is capable of effectively preventing damage of the structure and an equipment to which the structure is applied due to static electricity, shock and the like.

It is still another object of the present invention to provide a controller mounting structure which is capable of permitting the internal construction of a panel to be simplified.

It is yet another object of the present invention to provide a controller mounting structure which is capable of permitting an equipment to which the structure is applied to be significantly small-sized.

In accordance with the present invention, a controller mounting structure is provided. The controller mounting structure comprises a panel and a controller constituting a part of the panel and including an operation means. The controller is detachably mounted on the panel and the panel is formed with a mounting port through which the controller is detachably mounted on the panel. The controller is provided with a first connecting terminal means and the mounting port is provided with a second connecting terminal means. The first and second connecting terminal means are arranged so as to positionally correspond to each other, to thereby be electrically connected to each other when the controller is mounted in the mounting port of the panel. The structure also includes a terminal protecting element positioned forward of the second connecting terminal means, resulting in being contacted with the controller prior to the second connecting terminal means when the controller is mounted on the panel through the mounting port. The terminal protecting element functions to constantly force the controller in a controller removing direction until the controller is removed from the mounting port of the panel.

Also, in accordance with the present invention, a controller mounting structure is provided which includes a panel and a controller constituting a part of the panel and including an operation means. The controller is detachably mounted on the panel and the panel is formed with a mounting port through which the controller is detachably mounted on the panel. The controller is provided with a first connector and the mounting port is provided with a second connector. The first and second connectors are arranged so as to positionally correspond to each other, to thereby be electrically connected to each other when the controller is mounted in the mounting port of the panel. The structure also includes a terminal protecting element arranged forward of the second connector, resulting in being contacted with the controller prior to the second connector when the controller is mounted on the panel through the mounting port. The terminal protecting element constantly forces the controller in a controller removing direction until the controller is removed from the mounting port. Further, the structure includes guides provided on the sides of the second connector so as to align the first and second connectors with each other when the controller is mounted in the mounting port. The guides are engaged with one end of the terminal protecting element to regulate the outward displacement of the terminal protecting element.

Further, in accordance with the present invention, a controller mounting structure is provided which includes a panel and a controller constituting a part of the panel and including an operation means. The controller is detachably mounted on the panel and the panel is formed with a mounting port through which the controller is detachably mounted on the panel. The controller is provided with a first connecting terminal means and the mounting port is provided with a second connecting terminal means. The second connecting terminal means is bent in a predetermined direction with respect to the mounting port, to thereby exhibit elastic force. The first and second connecting terminal means are arranged so as to positionally correspond to each other, to thereby be electrically connected to each other when the controller is mounted in the mounting port of the panel. Also, the controller mounting structure includes an electrically conductive element positioned forward of the second connecting terminal means, resulting in being contacted with the controller prior to the second connecting terminal means when the controller is mounted on the panel through the mounting port.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Figure 1:
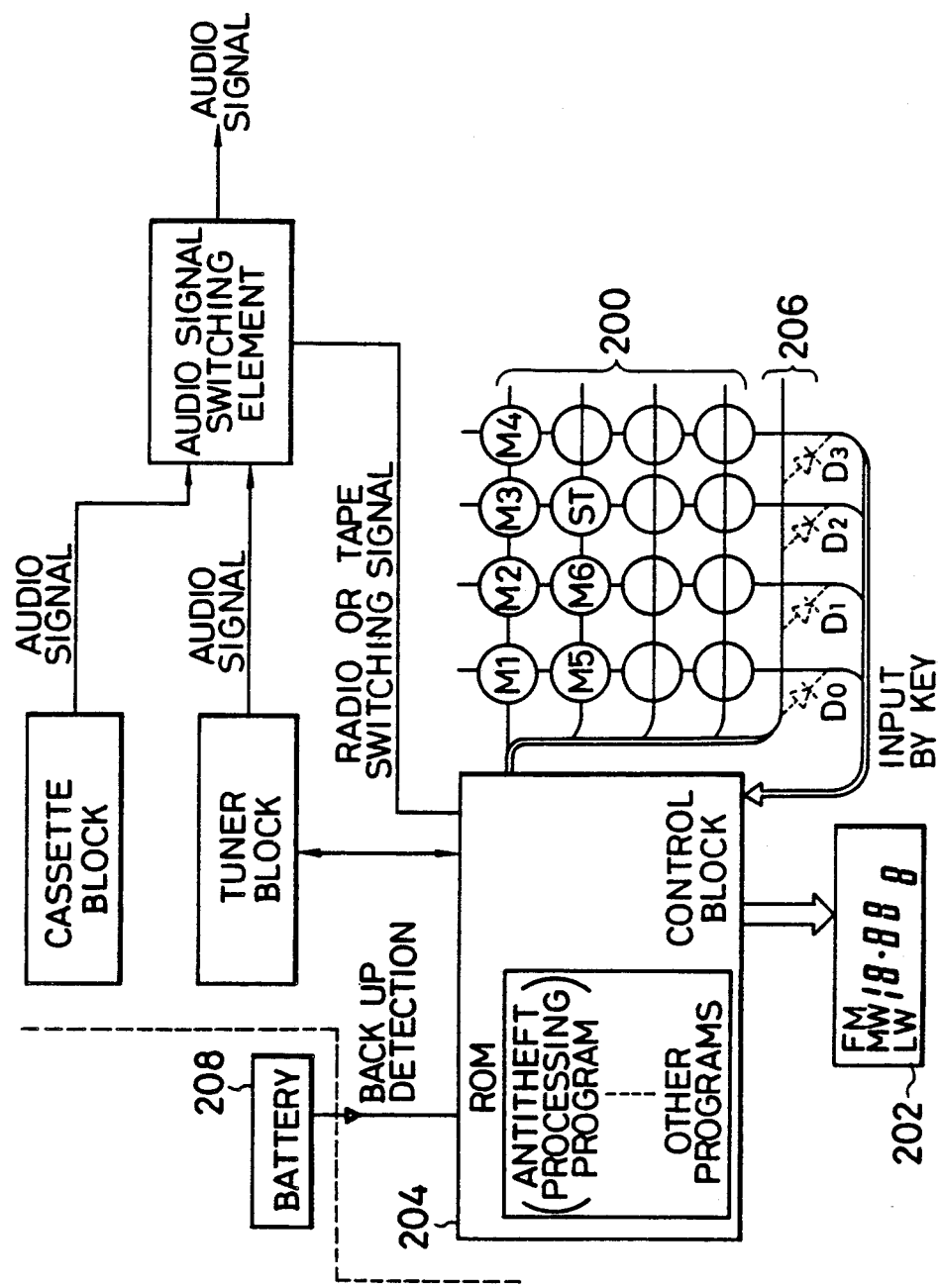
FIG. 1 is a block diagram showing an antitheft device conventionally used in a vehicle-mounted type acoustic equipment.
Figure 2:
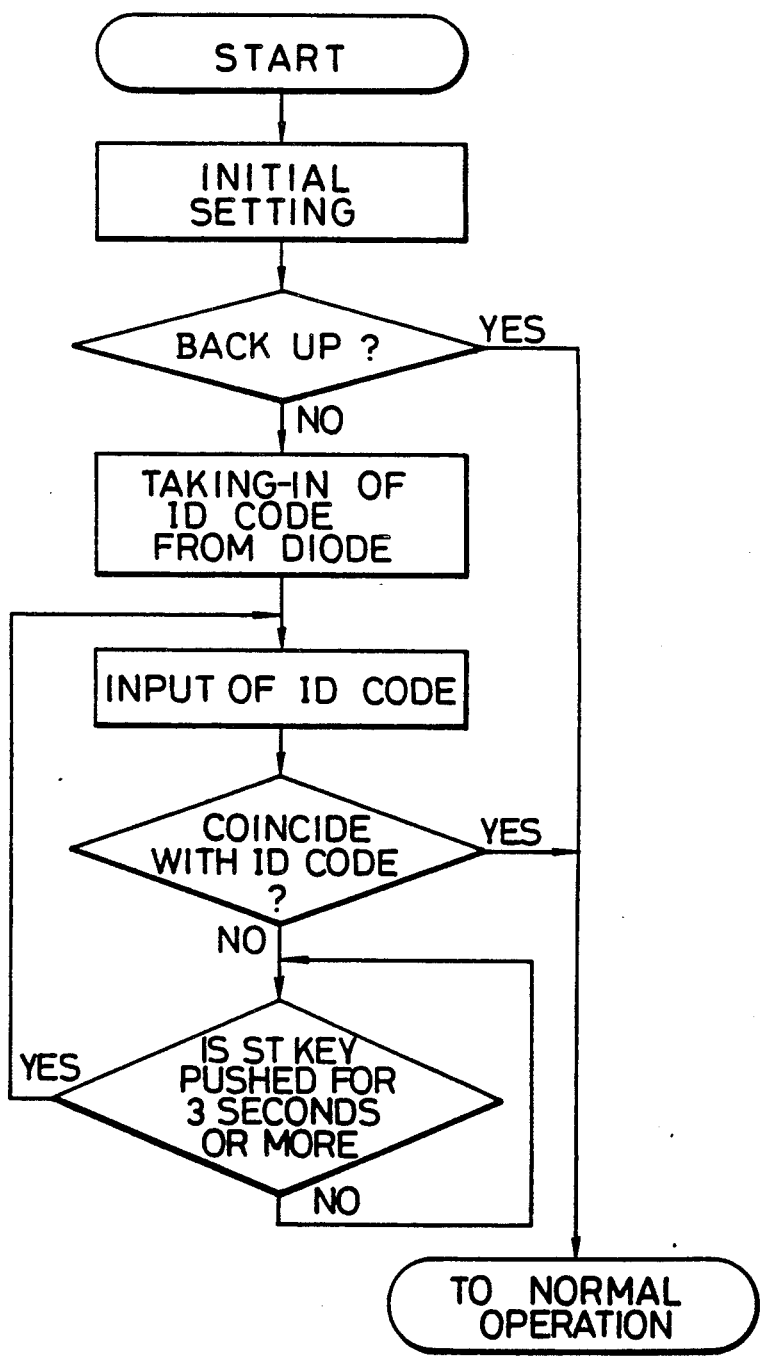
FIG. 2 is a flow chart showing the operation of the antitheft device of FIG. 1.
Figure 3:
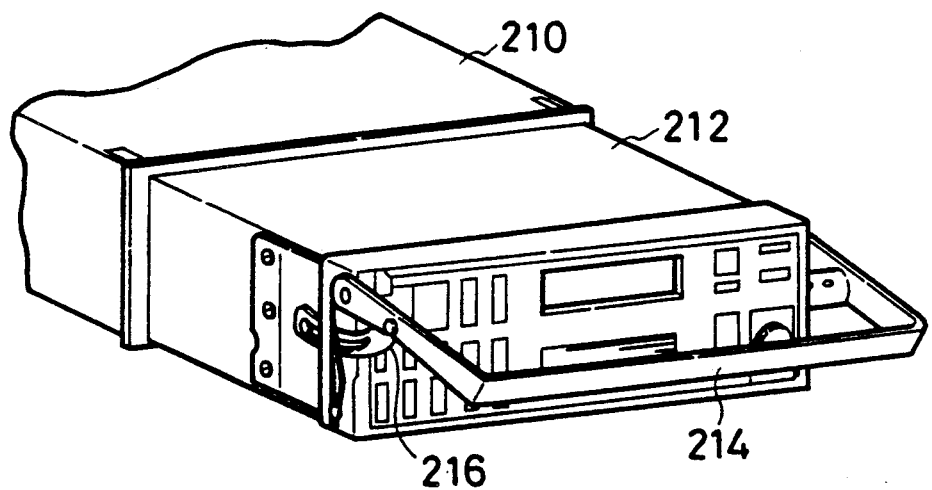
FIG. 3 is a fragmentary perspective view showing a conventional vehicle-mounted type electronic equipment.
Figure 4:
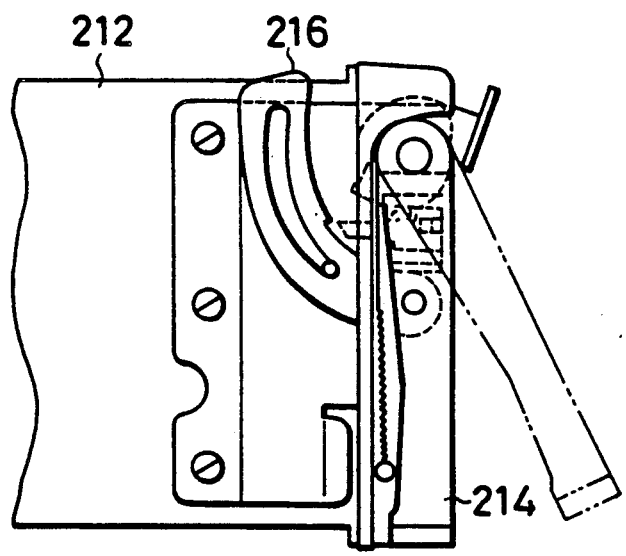
FIG. 4 is a fragmentary side elevation view of the electronic equipment shown in FIG. 3.
Figure 5:
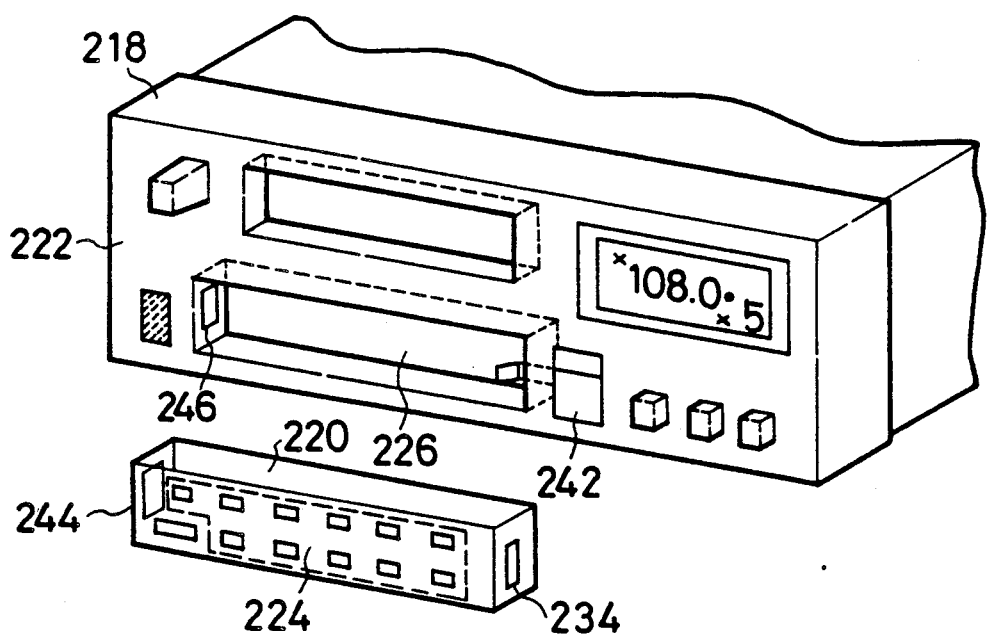
FIG. 5 is a fragmentary perspective view showing a conventional controller mounting structure.
Figure 6:
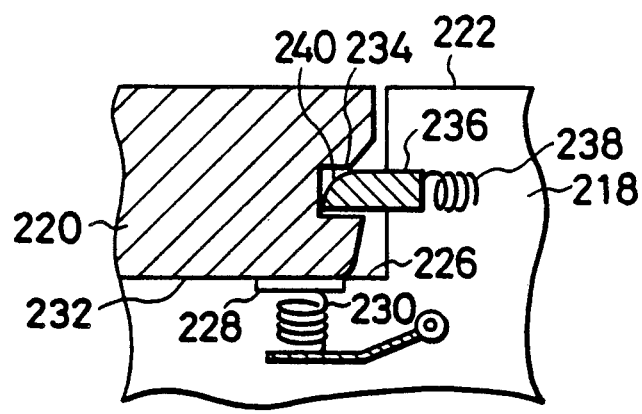
FIG. 6 is a fragmentary plan view partly in section of the conventional controller mounting structure shown in FIG. 5.

Now, a controller mounting structure according to the present invention will be described hereinafter with reference to FIGS. 7 to 18 wherein like reference numerals designate like or corresponding parts throughout.

Figure 7:
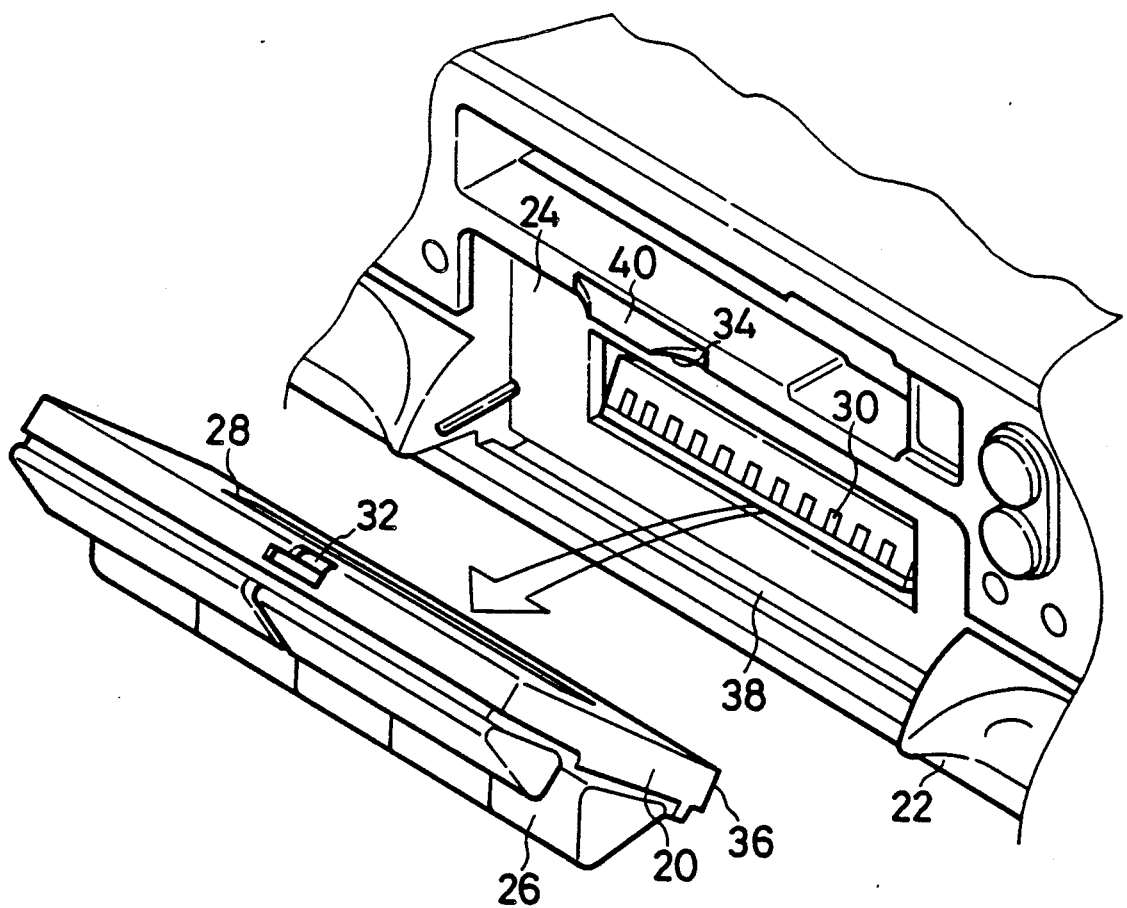
FIG. 7 is a fragmentary perspective view showing an embodiment of a controller mounting structure according to the present invention.
Figure 8:
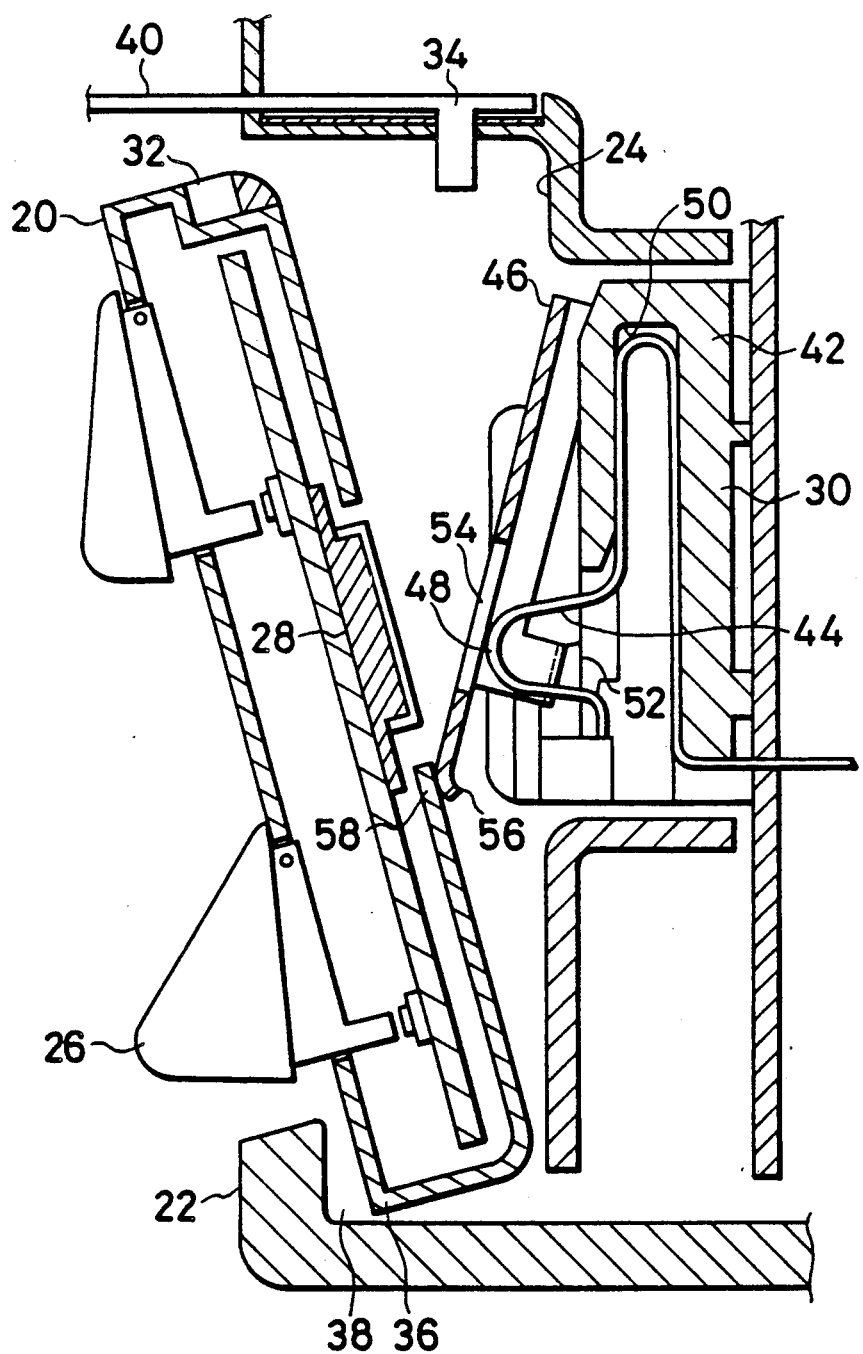
FIG. 8 is a sectional side election view of the controller mounting structure shown in FIG. 7.

Referring first to FIGS. 7 and 8 showing a first embodiment of a controller mounting structure according to the present invention which is adapted to detachably mount a controller on an electronic equipment such as a vehicle mounted type compact disc player or the like, a controller mounting structure of the illustrated embodiment includes a controller 20 detachably mounted on a front panel 22 of a body of an equipment to which the structure is applied. In the illustrated embodiment, the controller 20 is removably received in a mounting port 24 formed at the front panel 22, to thereby constitute a part of the panel 22. The controller 20 is provided on the front surface thereof with operation buttons 26 acting as an operation means. Also, the controller 20 is provided on the rear surface thereof with a connector 28 and the mounting port 24 is provided with a connector 30 in a manner to positionally correspond to the connector 28 of the controller 20, so that both connectors 28 and 30 are contacted with each other when the controller 20 is received in the mounting port 24, resulting in establishing electrical connection between the equipment body and the controller. Further, the controller 20 is formed on the upper surface thereof with an engagement groove 32 and the mounting port 24 is provided with an engagement projection or pin 34 in a manner to positionally correspond to the groove 32 or at the upper portion of the mounting port 24, so that the groove 32 and pin 34 are fittedly engaged with each other when the controller 20 is mounted in the mounting port 24 of the panel 22, to thereby fix the controller 20 to the panel 22. In addition, the controller 20 is provided on the lower surface thereof with a projection 36, which is adapted to be fittedly engaged with a recess 38 formed at the lower portion of the mounting port 24 when the controller 20 is mounted on the panel 22. The projection 36 acts as the center of pivotal movement of the controller 20 when the operation of detaching it from the panel is carried out. In the illustrated embodiment, the projection 36 and recess 38 may be formed so as to extend in the longitudinal direction of the controller 20 and panel 22, respectively.

The mounting port 24 is formed into a size sufficient to fit the controller 20 therein and has a depth sufficient to permit the operation means 26 to be aligned with or flash with the front panel 22. Also, the front panel 22 is provided at the portion thereof right above the mounting port 24 with a slidable release button 40. In the illustrated embodiment, the release button 40 may be formed integral with the engagement pin 34.

The connector 30 on the side of the panel 22 or equipment body which is provided in the mounting port 24 includes a connector body 42, connecting terminals 44 serving as a first connecting terminal means arranged in FIG. 8. The connecting terminals 44 each include an projection portion 48 formed at the lower portion thereof so as to outward or forward project. The connector body 42 is formed therein with a fit section 50 for securely fitting the connecting terminals 44 therein and also formed at the lower portion thereof with apertures or through-holes 52 via which the projection portions 48 of the connecting terminals 44 project outward or toward the controller 20.

Figure 9:
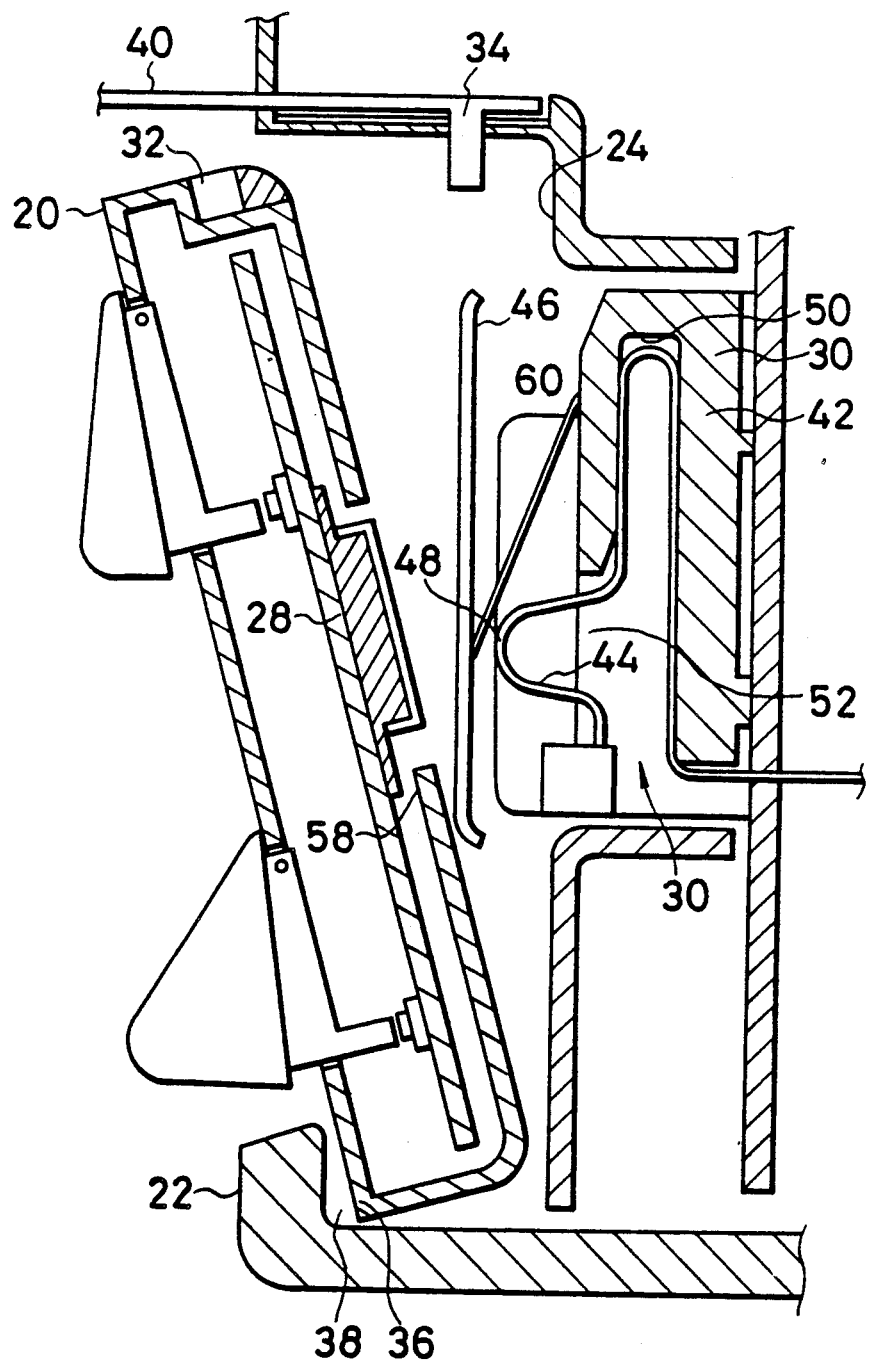
FIG. 9 is a sectional side elevation view showing a modification of the controller mounting structure shown in FIG. 7.

The knockout plate 46 is formed at the lower portion thereof with apertures or through-holes 54 via which the projection portions 48 of the connecting terminals 44 outward or forward extend and is constantly forward or outward forced at the lower portion thereof by a suitable urging means such as a spring or the like as shown in the embodiment depicted in FIG. 9. When the controller 20 is mounted on the panel 22 through the mounting port 24, the knockout plate 46 is inward pushed at the lower distal end 56 thereof by a rear surface member 58 of the controller 20, to thereby be pivotally moved toward the connecting terminals 44, resulting in the projection portions 48 of the connecting terminals 44 which project through the apertures 54 of the knockout plate 46 being contacted with the connector 28 of the controller 20 serving as a second connecting terminal means.

Thus, the knockout plate 46 is regulated to a predetermined angular position which permits the projections 48 of the connecting terminals 44 to be positioned inside the knockout plate 46 when no load is applied to the knockout plate, resulting in protecting the terminals 44. Therefore, it will be noted that in the illustrated embodiment, the knockout plate 46 functions as a terminal protecting element.

Now, the manner of operation of the controller mounting structure of the illustrated embodiment will be described hereinafter with reference to FIGS. 7 and 8.

When the controller 20 is to be mounted on the panel 22 or in the mounting port 24 of the panel 22, the controller 20 is obliquely downwardly inserted in the mounting port 24, to thereby cause the projection 36 to be abuttedly fitted in the recess 38. Then, the controller is pivotally moved about the projection 36 to cause the rear surface member 58 to be abutted against the lower distal end 56 of the knockout plate or terminal protecting element 46. At this time, the controller 20 is outward forced by the urging force of the knockout plate 46; therefore, even when the controller 20 is forcibly inserted in the mounting port 24, the insertion of the controller 20 may be damped to a certain degree. This causes shock occurring during the mounting operation to be reduced to prevent the connector 28 from forcibly colliding with the projection portions 48 of the connecting terminals 44, to thereby effectively protect the connectors 28 and 30. Then, the controller 20 is forced to positively contact the connectors 28 and 30 with each other to establish electrical connection between the controller 20 and the equipment and engage the engagement pin 34 with the engagement groove 32 to securely fit the controller 20 in the mounting port 24.

For the purpose of preventing the equipment body from being stolen, the removal of the controller 20 from the mounting port 24 is carried out by sliding the release button 40 to disengage the pin 34 from the groove 32, during which the knockout plate 46 outward forces the controller 20. This causes the controller 20 to be pivotally moved about the projection 36 in a direction away from the front panel 22, resulting in being readily detached or removed from the mounting port 24 by gravity.

FIG. 9 shows a modification of the controller mounting structure shown in FIGS. 7 and 8, wherein a knockout plate is constructed in a manner different from in the above-described embodiment.

In a controller mounting structure of the modification, a connector 30 provided on the side of the equipment body includes a connector body 42 and connecting terminals 44 arranged in the connector body 42 in substantially the same manner as in the embodiment described above. Also, the connector 30 includes a knockout plate 46 arranged at a position apart from the connecting terminals 44. The knockout plate 46 is provided in a manner to be movable back and forth and supported through a spring 60. Also, the knockout plate 46 is arranged so as to be abutted against the portion of a rear surface member 58 of the controller 20 at which a connector 28 is not provided. The spring 60 is engaged with the lower portion of the knockout plate 46 to constantly force the knockout plate in a direction in which the controller 20 is detached from a mounting port 24. The remaining part of the modification may be constructed in substantially the same manner as the above-described embodiment.

The modification constructed as described above not only exhibits the substantially the same advantages as the first embodiment, but is significantly simplified in construction because it is not required to form the knockout plate 46 with any apertures for extending projection portions 48 of the connecting terminals 44 therethrough. Also, the modification permits the knockout plate 46 to be positioned substantially in parallel to a rear surface member 58 of the controller 20, so that it is possible to abut the knockout plate 46 against the overall vertical length of the rear surface member 58 without large-sizing the whole structure, to thereby increase force for outward urging the controller 20.

As described above, the first embodiment is constructed in the manner that the terminal protecting element or member 46 is contacted with the controller 20 before the second connecting terminal means 44 are contacted therewith and functions to constantly force the controller in a controller removing direction or a direction of removing the controller from the equipment body until the former is detached or removed from the latter. Thus, the terminal protecting element acts as a damper during the controller mounting operation to protect the connecting terminals.

Figure 10:
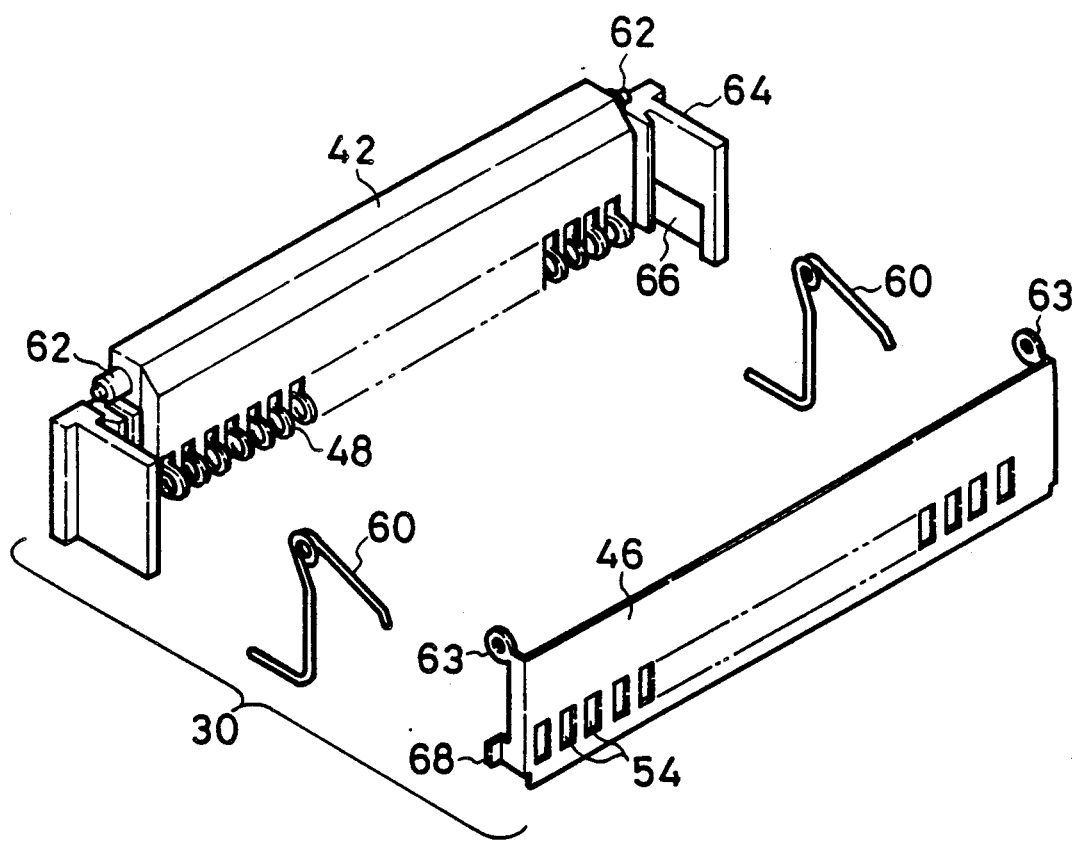
FIG. 10 is an exploded perspective view showing a combination of a connector of an equipment and a knockout plate in another embodiment of a controller mounting structure according to the present invention.
Figure 11:
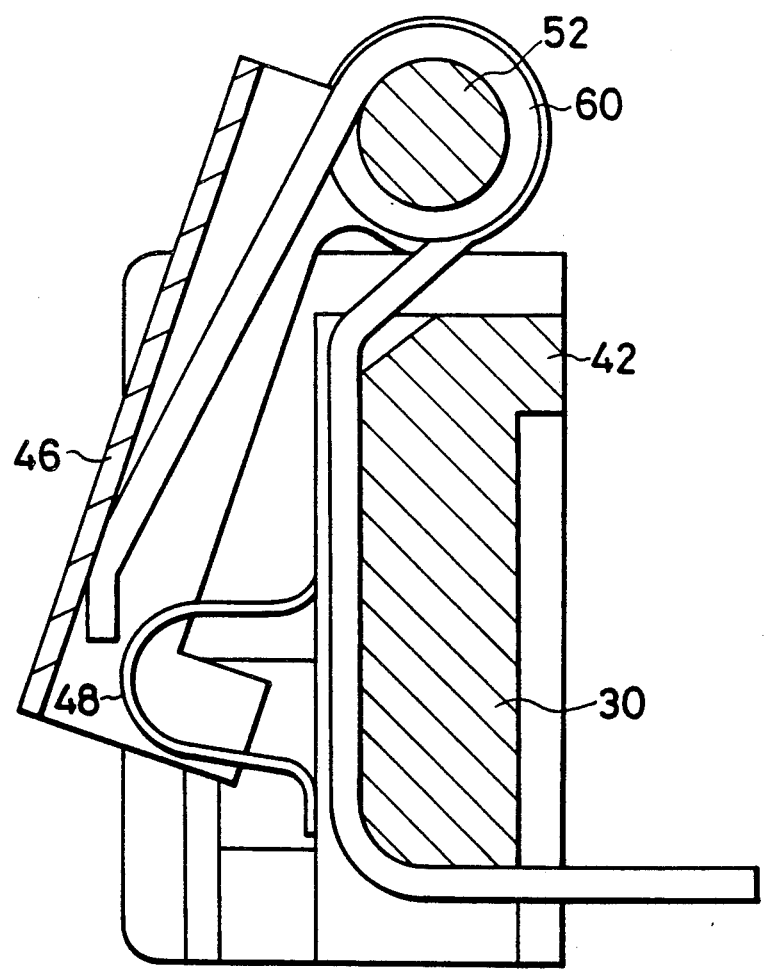
FIG. 11 is a sectional side elevation view of the combination shown in FIG. 10.
Figure 12:
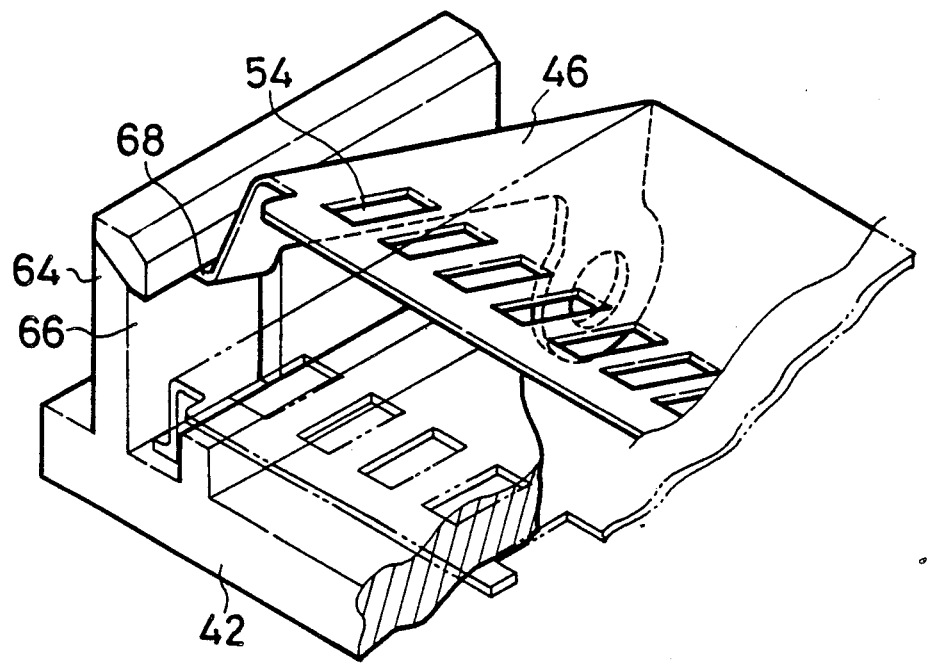
FIG. 12 is a fragmentary perspective view showing the engagement between the knockout plate and the connector shown in FIG. 10.
Figure 13:
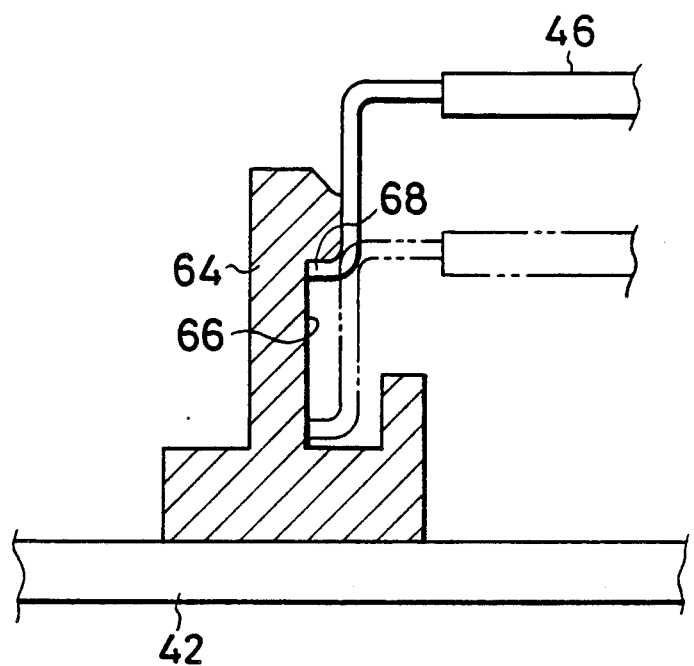
FIG. 13 is a sectional plan view of FIG. 12.

FIGS. 10 to 16 show another or a second embodiment of a controller mounting structure according to the present invention. In a controller mounting structure of the embodiment, a connector 30 arranged on the side of an equipment body and arranged in a mounting port 24 of a front panel 22 includes connecting terminals 44 and a knockout plate 46 which are integrally connected to each other. Also, the connector 30, as shown in FIGS. 10 and 11, includes a connector body 42 which is formed at each of both ends of the upper portion thereof with an outward or laterally extending column-like projection 62, on which a spring 60 and the knockout plate 46 are supported. More specifically, the knockout plate 46 is pivotally connected to the column-like projection 62 together with the spring 60 through a support hole 63 formed at each of both ends thereof, resulting in being made integral with the connector body 42 and pivotally moved about the holes 63 while being outward or forward urged by the springs 60. Also, the connector body 42 is provided on both sides thereof with guide members 64, which, as shown in FIGS. 12 and 13, are arranged in a manner to be perpendicular to the connector body 42 and so as to be positioned on the side of the knockout plate 46. The guide members 64 each are formed at the lower portion thereof with a guide groove 66 of a recessed shape.

The knockout plate 46 is constantly outward or forward urged by the springs 60 and formed at the lower portion thereof with apertures or through-holes 54 via which projection portions 48 of connecting terminals 44 outward project. Also, the knockout plate 46 is provided at each of both ends thereof with a crank 68, which is movably fitted or received in t he guide groove 66, so that the knockout plate 46 may be pivotally moved about the column-like projection 62 within the width of the guide groove 66, resulting in the displacement of the knockout plate 46 outward urged by the springs 60 being regulated.

Figure 14:
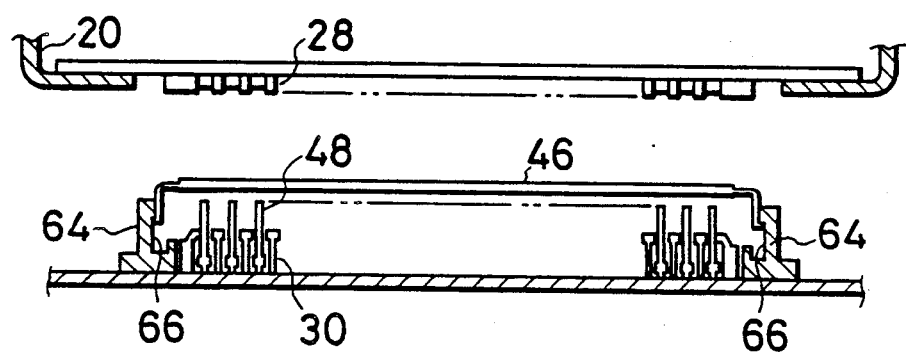
FIG. 14 is a fragmentary plan view partly in section showing connectors in the controller mounting structure shown in FIG. 10.
Figure 15:
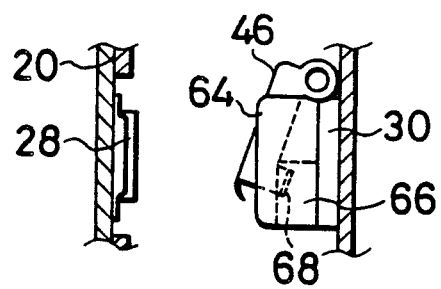
FIG. 15 is a fragmentary side elevation view partly in section of FIG. 14.
Figure 16:
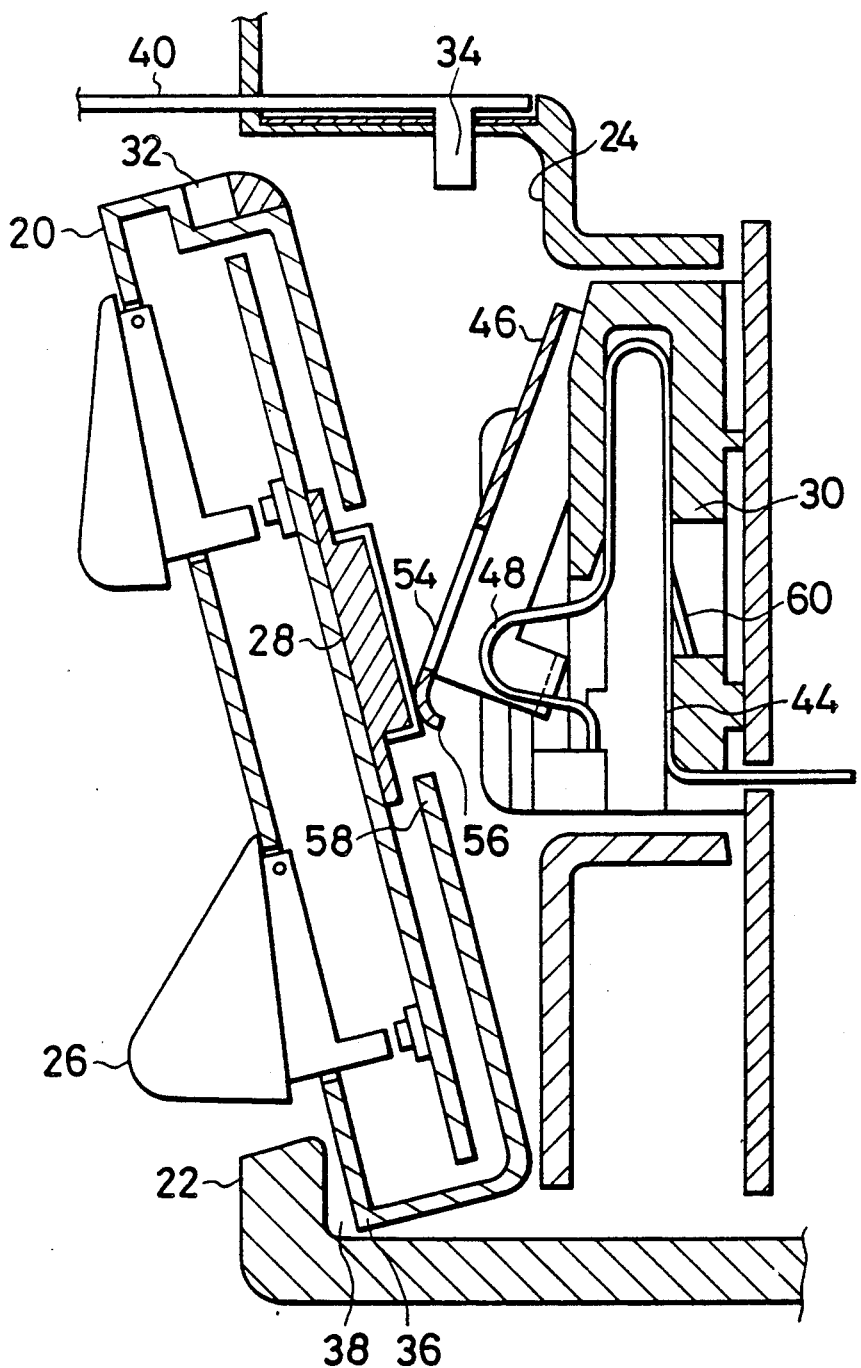
FIG. 16 is a sectional side elevation view of the controller mounting structure shown in FIG. 14.

When a controller 20 is inserted in the mounting port 24 of the panel 22, a connector 28 of the controller 20, as shown in FIGS. 14 and 15, is guided at both ends thereof along the guide members 64. Also, as shown in FIG. 16, when a projection 36 of the controller 20 is engaged with a recess 38 of the mounting port 24, the lower distal end 56 of the knockout plate 46 is abutted against the lower portion of the connector 28.

The remaining part of the second embodiment may be constructed in substantially the same manner as the above-described first embodiment.

In the controller mounting structure of the illustrated embodiment constructed as described above, the guide members 64 each carry out the alignment or registration between the connectors 28 and 30 when the controller 20 is mounted on the equipment body. Also, the cranks 68 of the knockout plate 46 are engaged with the guide grooves 66 of the guide member 64 to regulate the outward displacement of the knockout plate 46. Also, the second embodiment is simplified in construction, because the knockout plate 46 and connector 30 are connected integral with each other, resulting in reducing the number of steps in the manufacturing and assembling and the manufacturing cost. This also causes a space for the connector 30 in the mounting port 24 to be reduced, so that the structure may be small-sized. Further, the knockout plate is constantly outward urged by the springs 60; therefore, even when the controller 20 is forcibly inserted in the mounting port 24, the insertion of the controller 20 may be significantly damped, resulting in shock occurring due to abutment between the connector 28 and the projection portions 48 of the connecting terminals 44 when the controller 20 is mounted in the mounting port 24 being reduced to prevent damage and deformation of the connectors 28 and 30. When the controller is to be removed from the mounting port 24, a release button 40 is slid to disengage an engagement pin 34 from an engagement groove 32, to thereby cause the knockout plate 46 to outward force the controller 20 from the mounting port 24. This resulsts in the controller 20 being outward pivotally moved about the projection 36, so that it may be readily removed from the mounting port 24.

In the second embodiment, the knockout plate 46 may be made of an electrically conductive material. This permits static electricity charged on the connector 28 to be removed when the knockout plate 46 is contacted with the connector 28, so that the equipment body is prevented from being damaged due to static electricity. Also, the position at which the knockout plate 46 is abutted against the controller 20 is not limited to the connector 28. The abutment may be carried out at any position so long as it permits the controller to be outward pushed out.

As described above, the second embodiment is so constructed that the guide members for registering the first and second connecting terminal means with each other are provided on both sides of the second connecting terminal means. Such simple construction permits the guide members to be engaged with one end of the knockout plate or terminal protecting member to regulate the outward displacement of the terminal protecting member. Also, in the second embodiment, the terminal protecting member may be made integral with the connecting terminals. Thus, the embodiment effectively reduces the number of steps in the manufacturing of the structure and permits the structure to be significantly small-sized.

Figure 17:
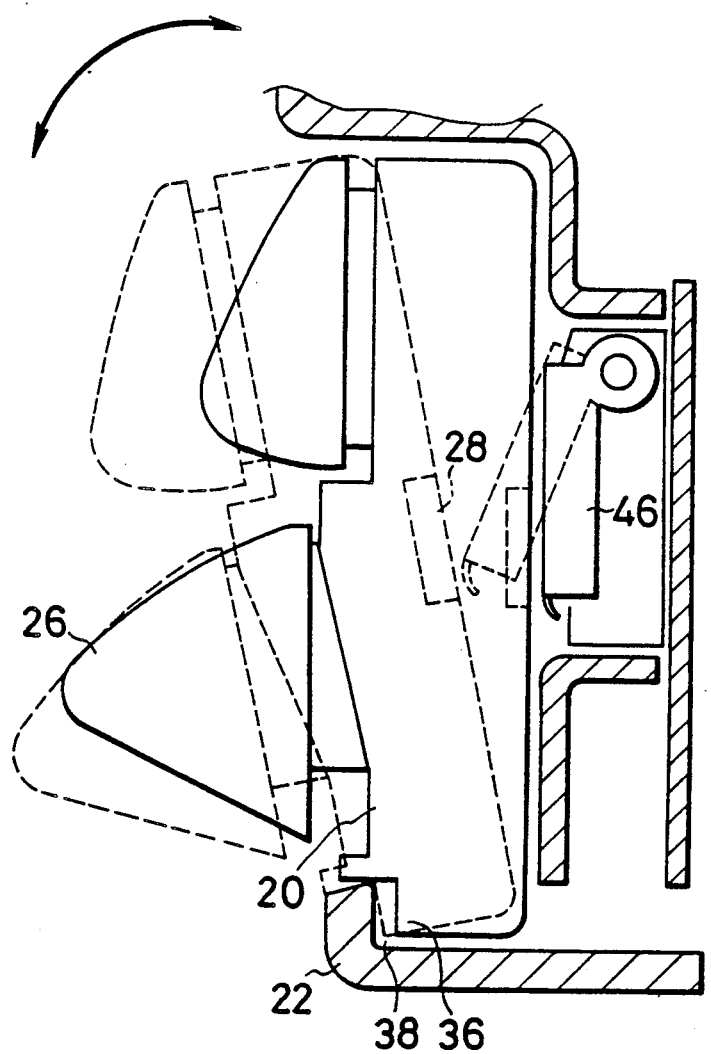
FIGS. 17 and 18 each are a sectional side elevation view showing a further embodiment of a controller mounting structure according to the present invention.
Figure 18:
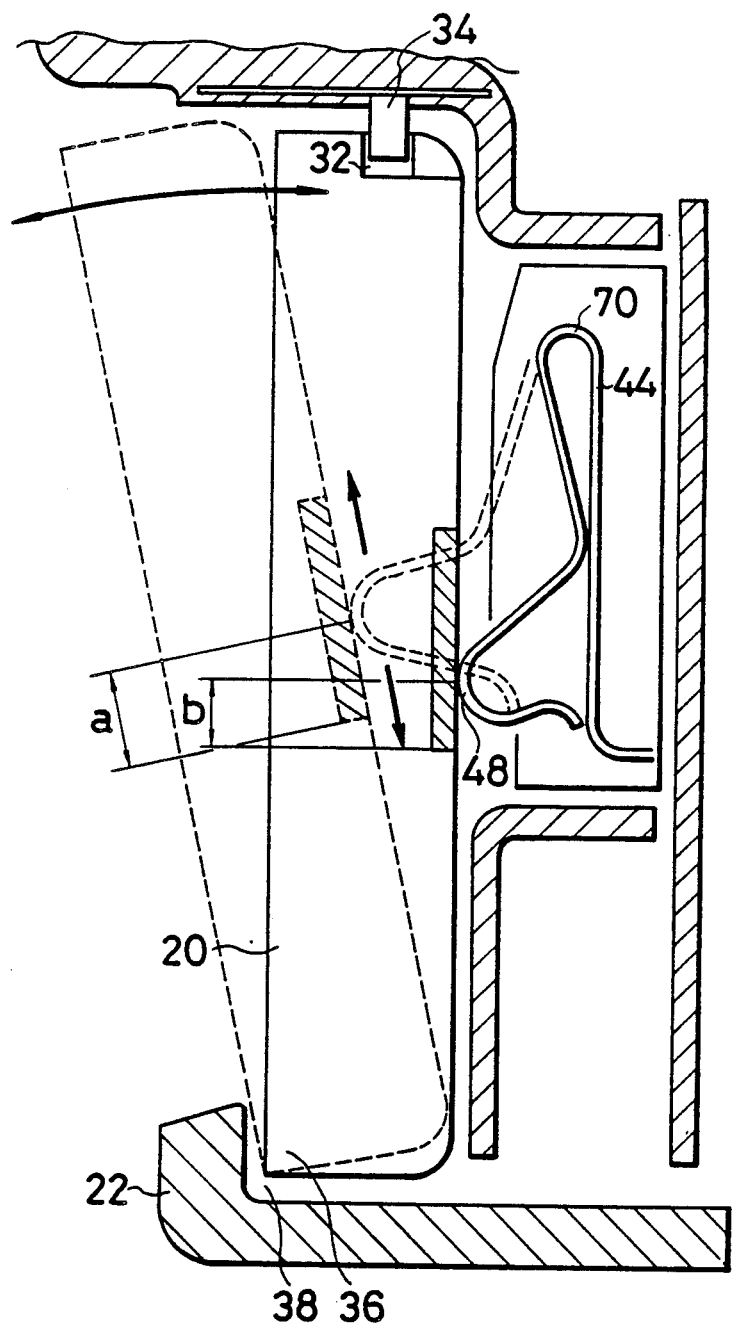

FIGS. 17 and 18 show a further or third embodiment of a controller mounting structure according to the present invention. In a controller mounting structure of the third embodiment, a knockout plate 46 which is contacted with a connector 28 of a controller 20 when the controller 20 is mounted in a mounting port 24 is formed of an electrically conductive material into substantially the same shape as that in the second embodiment described above. Also, in the third embodiment, as shown in FIG. 18, connecting terminals 44 arranged in the mounting port 24 each include a projection portion 48 projecting toward the controller 20 and is generally bent into a shape like a hair pin, of which the bent portion or the upper end 70 acts as a fulcrum so that the projection portion 48 may be urged toward the controller 20.

In the third embodiment constructed as described above, in order to mount the controller 20 in the mounting port 24, the controller 20 is downward inserted in the mounting port 24, so that a projection 36 is engagedly fitted in a recess 38 to cause the controller 20 to be pivotally moved toward the connecting terminals 44, resulting in being erect. When the pivotal movement of the controller 20 advances, the knockout plate 46 is contacted with the connector 28. However, the knockout plate 46 is made of an electrically conductive material, therefore, it escapes static electricity charged on the connector 28, to thereby prevent it from being transmitted from the connecting terminals 44 to an equipment body, resulting in preventing a circuit contained in the equipment body from being damaged due to static electricity. Thus, it will be noted that in the third embodiment, the knockout plate 46 constitutes an electrically conductive element exhibiting a static electricity removing action as well as a shock absorbing action.

When the dimension between a position at which the projection portion 48 of the connecting terminal 44 is contacted with the connector 28 and the lower end of the connector 28 is indicated as "a" and the dimension between a position at which the projection 48 is contacted with the connector 28 when the controller 20 is further pivotally moved to engage the engagement groove 32 with the engagement pin 34 to mount the controller 20 in the mounting port 24 and the lower end of the connector 28 is indicated as "b" as shown in FIG. 18, the projection portion 48 is downward moved on the connector 28 by a distance of a-b (a b) until the controller 20 is mounted in the mounting port 24. This causes the projection portion 48 to be rubbed against the connector 28, resulting in dust which adheres to the projection portion 48 being removed. Thus, the projection portion 48 of each of the connecting terminals 44 is cleaned up every time when the controller 20 is mounted in the mounting port 24.

In the third embodiment, the recess 38 about which the controller 20 is pivotally moved is provided at the lower portion of the mounting port 22, thus, the controller 20 is constantly downward inserted in the mounting port 24. This causes stress to be downward applied to the connecting terminals 44 when they are contacted with the connector 28. However, each of the connecting terminals 44 is provided at the upper end thereof with the fulcrum 70, so that one of the sides of the connecting terminal 44 may be pivotally moved about the fulcrum 70 to absorb the stress. This results in deformation and damage of the connecting terminal 44 being minimized or substantially prevented even when large shock is downward applied thereto. Also, in the third embodiment as well as the first and second embodiments described above, the knockout plate 46 acts as a shock absorber when controller 20 is mounted in the mounting port 24, to thereby protect the connecting terminals 44. Also, the knockout plate 46 serves to outward force the controller 20 during the controller removing operation, so that it may be readily detached or removed from the mounting port 24.

The connecting terminals 44 may be arranged inside the knockout plate 46. Such arrangement effectively prevents the connecting terminals from being damaged even when the controller 20 is carelessly or erroneously inserted in the mounting port 24.

As described above, in the third embodiment, the knockout plate or electrically conductive element contacted with the second connecting terminal means during the mounting of the controller functions as both a static electricity removing element and a shock absorber to prevent the structure and equipment body from being damaged mechanically or electrically. Also, the conductive member and second connecting terminal means are rubbed with each other to keep the connecting terminal means always cleaned, to thereby permit the structure to be operated with high reliability. In addition, the second terminal means is bent so as to exhibit elastic force in a predetermined direction, to thereby absorb stress occurring therein during the controller mounting operation, so that the deformation and damage of the second connecting terminal means may be positively prevented.

The above-described embodiments each are not limited to the manners described above. For example, the materials, shapes, dimensions of the connecting terminals, knockout plate, guide member and the like may be widely varied in the scope of the present invention.

As can be seen from the foregoing, the present invention permits the controller to be removed from the equipment body for the antitheft purpose and effectively prevents the equipment as well as the structure from being damaged. Also, the controller mounting structure of the present invention is widely applicable to an electronic equipment of the type that connecting terminals are arranged on both a remote control unit on which a controller is integrally mounted and a panel on which the remote control unit, resulting in being used for not only a vehicle mounted type electronic equipment but a domestic electronic equipment.

While preferred embodiment of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A controller mounting structure, comprising:
   (a) a panel including a mounting port, a second connecting terminal means within the mounting port;
   (b) a controller having an operation means, the controller being detachably mounted to the panel through the mounting port, the controller including a first connecting terminal means;
   (c) the first and second terminal means positionally corresponding such that the first and second terminal means will be electrically connected when the controller is mounted within the mounting port;
   (d) a terminal protecting element positioned forward of the second terminal means such that the controller contacts the terminal protecting element before the second terminal means makes electrical contact with the first terminal means when the controller is being mounted within the mounting port; and
   (e) an urging member for providing a constant removing force to a lower portion of the terminal protecting element, the removing force constantly forcing the controller in a controller removing direction until the controller is removed from the mounting port.

2. A controller mounting structure as defined in claim 1, wherein the first connecting terminal means is provided on a rear surface of the controller.

3. A controller mounting structure as defined in claim 1, wherein said controller has an engagement groove formed in the controller; and
   the panel is provided with an engagement pin extending into said mounting port;
   said engagement groove and engagement pin being engaged with each other to securely mount said controller in said mounting port.

4. A controller mounting structure as defined in claim 1, wherein said controller includes a projection on a lower surface; and
   the panel defining said mounting port provided at a lower portion with a recess;
   said projection and recess being fittably engaged with each other.

5. A controller mounting structure as defined in claim 1, further including a slidable release button provided on the panel to detach the controller from the mounting port.

6. A controller mounting structure as defined in claim 2, wherein the mounting port is provided therein with a connector body;
   said second connecting terminal means and said terminal protecting element arranged within the connector body.

7. A controller mounting structure as defined in claim 1, wherein said second connecting terminal means includes a projection portion projecting toward said first connecting terminal means;
   said projection portion of said second connecting terminal means being contacted with said first connecting terminal means.

8. A controller mounting structure as defined in claim 7, wherein said terminal protecting element includes an aperture means through which said projection portion of said second connecting means extends.

9. A controller mounting structure as defined in claim 1, wherein said terminal protecting element is supported at a position apart from said second connecting terminal means.

10. A controller mounting structure as defined in claim 7, wherein said terminal protecting element is regulated to a predetermined angular position to cause said projection portion of said second connecting terminal means to be constantly positioned inside said terminal protecting element when no load is applied.

11. A controller mounting structure, comprising:
(a) a panel including a mounting port, a second connecting terminal means within the mounting port;
(b) a controller having an operation means, the controller being detachably mounted to the panel through the mounting port, the controller including a first connecting terminal means;
(c) the first and second terminal means positionally corresponding such that the first and second terminal means will be electrically connected when the controller is mounted within the mounting port;
(d) a terminal protecting element positioned forward of the second terminal means such that the controller contacts the terminal protecting element before the second terminal means makes electrical contact with the first terminal means when the controller is being mounted within the mounting port;
(e) an urging member for providing a constant removing force to a lower portion of the terminal protecting element, the removing force constantly forcing the controller in a controller removing direction until the controller is removed from the mounting port; and
(f) the controller including a projection on a lower surface to fittably mate with a recess at a lower portion of the panel defining said mounting port.

12. A controller mounting structure, comprising:
(a) a panel including a mounting port, a second connecting terminal means within the mounting port;
(b) a controller having an operation means, the controller being detachably mounted to the panel through the mounting port, the controller including a first connecting terminal means;
(c) the first and second terminal means positionally corresponding such that the first and second terminal means will be electrically connected when the controller is mounted within the mounting port;
(d) a terminal protecting element positioned forward of the second terminal means such that the controller contacts the terminal protecting element before the second terminal means makes electrical contact with the first terminal means when the controller is being mounted within the mounting port;
(e) an urging member for providing a constant removing force to a lower portion of the terminal protecting element, the removing force constantly forcing the controller in a controller removing direction until the controller is removed from the mounting port; and
(f) a projection at a lower portion of the second terminal means, the projection projecting toward the first terminal means and contacting the first terminal means when the controller is mounted within the mounting port, the terminal protecting element biased to a predetermined angular position, and the projection being positioned behind the terminal protecting element when the controller is not mounted within the mounting port.

13. A controller mounting structure as defined in claim 12, wherein the terminal protecting element has an aperture at a lower portion, the projection fitting through the aperture when the controller is mounted in the mounting port.

* * * * *